United States Patent
Wang et al.

(10) Patent No.: US 7,732,337 B2
(45) Date of Patent: Jun. 8, 2010

(54) METHOD FOR MANUFACTURING THE SHALLOW TRENCH ISOLATION STRUCTURE

(75) Inventors: Jiann-Jong Wang, Taipei (TW); Chi-Long Chung, Miaoli County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 11/834,024

(22) Filed: Aug. 6, 2007

(65) Prior Publication Data

US 2008/0280418 A1    Nov. 13, 2008

(30) Foreign Application Priority Data

May 8, 2007    (TW)    .............................. 96116269 A

(51) Int. Cl.
*H01L 21/302* (2006.01)

(52) U.S. Cl. ...................... 438/702; 438/700; 438/703; 438/723; 438/724; 438/745; 438/761; 438/778; 438/942

(58) Field of Classification Search ................ 438/700, 438/702, 703, 704, 706, 723, 724, 745, 761, 438/778, 787, 791, 942, FOR. 118, FOR. 388, 438/FOR. 395

See application file for complete search history.

(56) References Cited

U.S. PATENT DOCUMENTS

| 5,256,584 | A  | * | 10/1993 | Hartmann | .................... | 438/257 |
| 6,376,293 | B1 | * | 4/2002 | Chapman | .................... | 438/199 |
| 6,475,875 | B1 | * | 11/2002 | Hau et al. | .................... | 438/424 |
| 2004/0029353 | A1 | * | 2/2004 | Zheng et al. | ................. | 438/424 |
| 2004/0038466 | A1 | * | 2/2004 | Yen et al. | ..................... | 438/197 |
| 2006/0027904 | A1 | * | 2/2006 | Hasebe et al. | ................ | 257/678 |
| 2007/0178664 | A1 | * | 8/2007 | Tseng et al. | ................. | 438/424 |
| 2008/0032482 | A1 | * | 2/2008 | Tsai et al. | .................... | 438/424 |
| 2008/0157264 | A1 | * | 7/2008 | Zhao et al. | ................... | 257/510 |

* cited by examiner

*Primary Examiner*—N Drew Richards
*Assistant Examiner*—Joannie A Garcia
(74) *Attorney, Agent, or Firm*—Jianq Chyun IP Office

(57) ABSTRACT

A method for manufacturing a shallow trench isolation (STI) structure is provided. In the method, a substrate is initially provided. Then, a patterned pad layer and a patterned mask layer are successively formed in order on the substrate. After that, a portion of the substrate is removed by using the patterned mask layer and the patterned pad layer as a mask to form trenches in the substrate. Next, a first insulation layer is formed in the trenches. Afterwards, a protection layer is conformally formed on the substrate. Then, a second insulation layer is formed on the protection layer above the first insulation layer. Next, the patterned mask layer and the patterned pad layer are removed. Finally, a portion of the protection layer and the second insulation layer are removed.

8 Claims, 5 Drawing Sheets

METHOD FOR MANUFACTURING THE SHALLOW TRENCH ISOLATION STRUCTURE

CROSS-REFERENCE TO RELATED APPLICATION

This application claims the priority benefit of Taiwan application serial no. 96116269, filed May 8, 2007. All disclosure of the Taiwan application is incorporated herein by reference.

BACKGROUND OF THE INVENTION

1. Field of the Invention

The present invention is related to a method for manufacturing an isolation structure and more particularly to a method for manufacturing a shallow trench isolation (STI) structure.

2. Description of Related Art

With the improvement of semiconductor technology, the size of the semiconductor component is continuously decreased even to the sub-micron. Meanwhile, components further shrink to more minute sizes. Accordingly, the isolation between components becomes a very important issue since the isolation can effectively prevent adjacent components from being short circuited.

In order to prevent adjacent components from being short-circuited, generally an isolation layer is added between components. The more widely-applied technique is a local oxidation of silicon (LOCOS) process. However, the LOCOS process has some disadvantages such as the problems resulted from the stress, or the bird's beak formed around the isolation structure. Nowadays, the most popular method used in the industry is a shallow trench isolation (STI) manufacturing process.

FIGS. 1A through 1C are cross-sectional views illustrating a conventional manufacturing process of an STI structure. Initially, as shown in FIG. 1A, a substrate 100 is provided. Then, a patterned pad layer 102 and a patterned mask layer 104 are successively formed in order on the substrate 100. Thereafter, an etching process is implemented to form trenches 106 in the substrate 100 by using the patterned pad layer 102 and the patterned mask layer 104 as a mask.

Then, referring to FIG. 1B, an insulation material layer (not shown) is formed on the substrate 100 and fills up the trenches 106. After that, a chemical mechanical polishing process is implemented by using the patterned mask layer 104 as a polishing stop layer to planarize the insulation material layer. As a result, an insulation layer 108 is formed in the trenches 106. Then, a wet etching process is implemented to remove the residual insulation material layer on the patterned mask layer 104. While the wet etching process is being implemented, a portion of the insulation layer 108 in the trenches 106 may also be simultaneously removed.

Continually, referring to FIG. 1C, the patterned mask layer 104 is initially removed, and then the patterned pad layer 102 is removed by the wet etching process so as to accomplish manufacturing the STI structure.

However, while the patterned pad layer 102 is being removed, the STI structure (the insulation layer 108) underneath the surface of the substrate 100 may be etched by the etchant used in the wet etching process. As a result, divots are formed at the corner regions 110 of the insulation layer 108, which affects the follow-up manufacturing process. For example, since a polysilicon layer is initially formed on the substrate and the etching process is then implemented during the process for manufacturing a gate, the polysilicon layer usually remains in the divots at the corner regions 110 of the insulation layer 108 when the divots exists thereat, which may cause a short circuit in the subsequently formed components.

In addition, the divots are formed not only while removing the patterned pad layer 102, but usually formed while removing the patterned mask layer 104.

SUMMARY OF THE INVENTION

Accordingly, one aspect of the present invention is directed to a method for manufacturing a shallow trench isolation (STI) structure which can prevent the STI structure from forming divots at the corner regions of STI structure.

The present invention discloses a method for manufacturing the STI structure, which a substrate is initially provided. Then, a patterned pad layer and a patterned mask layer are successively formed in order on the substrate. After that, a portion of the substrate is removed to form trenches in the substrate by using the patterned mask layer and the patterned pad layer as a mask. Next, a first insulation layer is formed in the trenches. Thereafter, a protection layer is conformally formed on the substrate. Then, a second insulation layer is formed on the protection layer above the first insulation layer. Next, the patterned mask layer and the patterned pad layer are removed. Finally, a portion of the protection layer and the second insulation layer are removed.

According to a method for manufacturing a shallow trench isolation (STI) structure in an embodiment of the present invention, the material of the said protection layer is silicon oxynitride, for example.

According to the method for manufacturing the STI structure in an embodiment of the present invention, the method for removing the portion of the said protection layer and the second insulation layer includes a wet etching process, for example.

According to the method for manufacturing the STI structure in an embodiment of the present invention, a wet etching process can be further implemented after the first insulation layer is formed and before the protection layer is formed.

According to the method for manufacturing the STI structure in an embodiment of the present invention, a wet etching process can be further implemented after the second insulation layer is formed and before the patterned mask layer and the patterned pad layer are removed.

According to the method for manufacturing the STI structure in an embodiment of the present invention, the method for forming the said first insulation layer is initially forming an insulation material layer on the substrate, for example. Next, a chemical mechanical polishing process is implemented by using the patterned mask layer as a polishing stop layer.

According to the method for manufacturing the STI structure in an embodiment of the present invention, the method for forming the said second insulation layer is initially forming an insulation material layer on the substrate, for example. Next, a chemical mechanical polishing process is implemented by using the patterned mask layer as a polishing stop layer.

According to the method for manufacturing the STI structure in an embodiment of the present invention, the material of the said patterned pad layer is silicon oxide, for example.

According to the method for manufacturing the STI structure in an embodiment of the present invention, the method for forming the said patterned pad layer is thermal oxidation process, for example.

According to the method for manufacturing the STI structure in an embodiment of the present invention, the material of the said patterned mask layer is silicon nitride, for example.

According to the method for manufacturing the STI structure in an embodiment of the present invention, the material of the said first insulation layer is silicon oxide, for example.

According to the method for manufacturing the STI structure in an embodiment of the present invention, the material of the said second insulation layer is silicon oxide, for example.

Since a protection layer and another insulation layer are formed on the insulation layer in the trenches before the patterned mask layer and the patterned pad layer are removed in the present invention, when the patterned mask layer and the patterned pas layer are removed, the insulation layer in the trenches can be prevented from being damaged and from forming divots at the corner regions the insulation layer. In addition, the present invention also improves uniformity in the step height of the substrate surface by controlling the thickness of the protection layer.

In order to make the aforementioned features and advantages of the present invention more comprehensible, several embodiments accompanied with figures are described in detail below.

DESCRIPTION OF EMBODIMENTS

FIGS. 2A through 2F are cross-sectional views showing a process for manufacturing a shallow trench isolation (STI) structure according to an embodiment of the present invention.

Figure 1A:
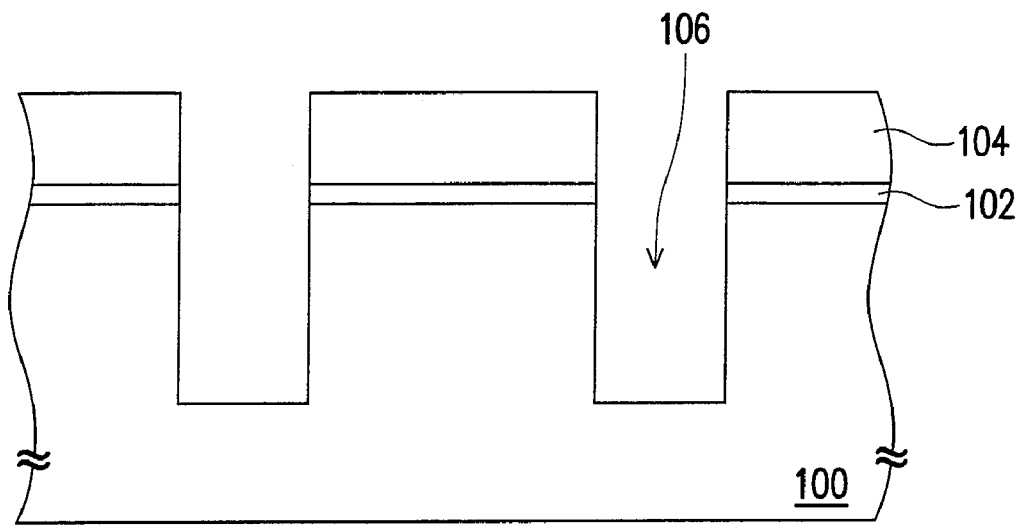
FIGS. 1A through 1C are cross-sectional views showing a conventional process for manufacturing a shallow trench isolation (STI) structure.
Figure 1B:
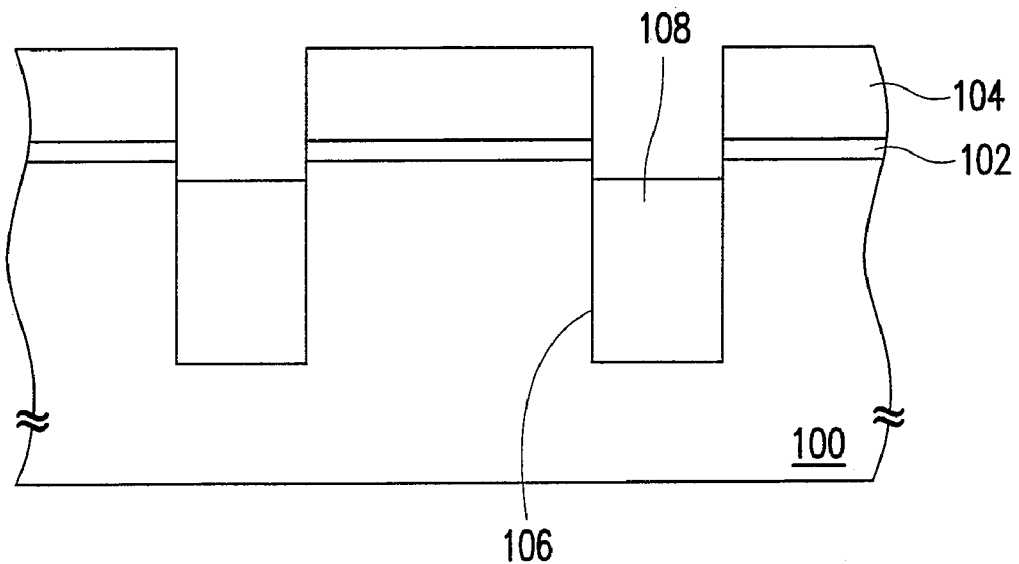
Figure 1C:
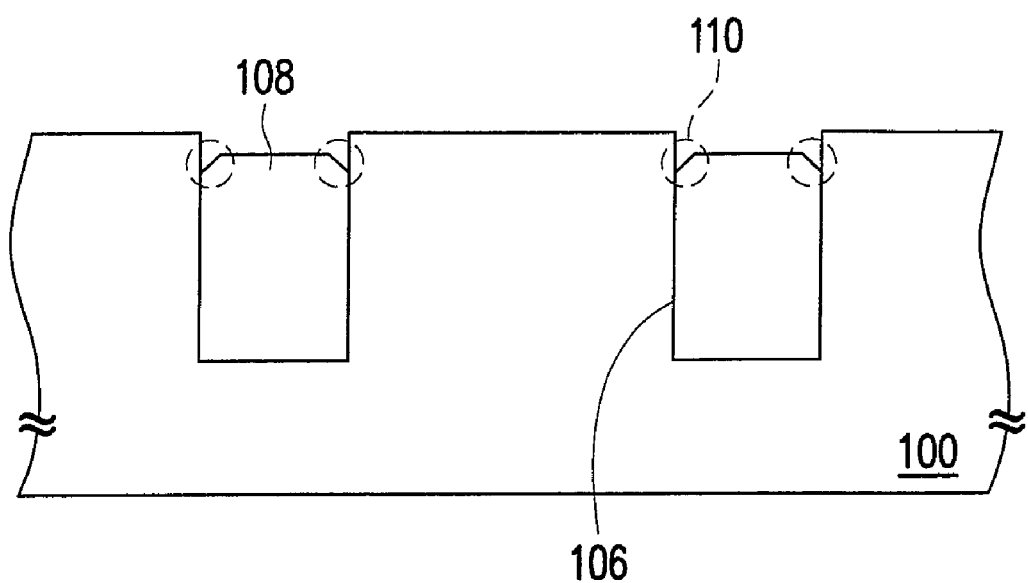
Figure 2A:
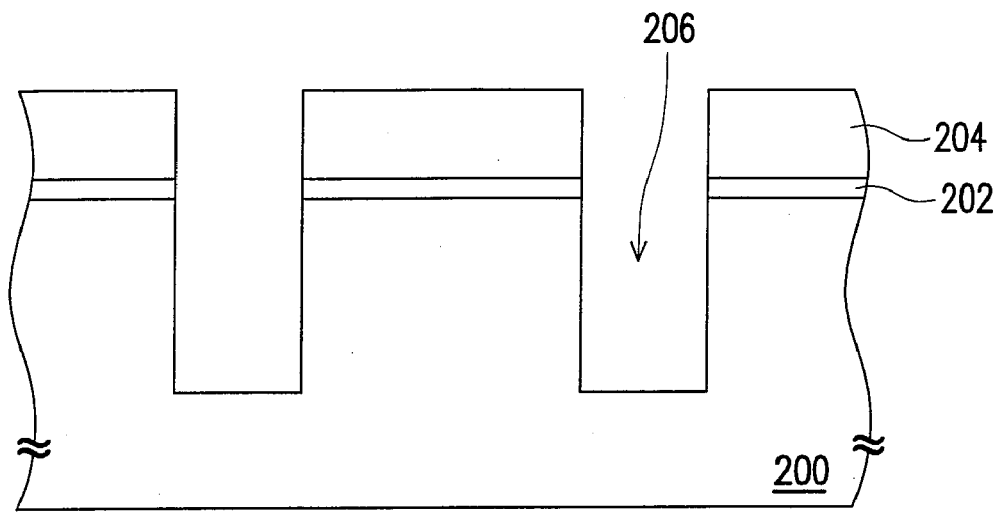
FIGS. 2A through 2F are cross-sectional views showing a process for manufacturing an STI structure according to an embodiment of the present invention.

Initially, referring to FIG. 2A, a substrate 200 is provided. The substrate 200 is, for example, a silicon substrate. Then, a pad material layer (not shown) and a mask material layer (not shown) are successively formed in order on the substrate 200. The material of the pad material layer is silicon oxide, and the method for forming the pad material layer is a thermal oxidation process, for example. The material of the mask material layer is silicon nitride, and the method for forming the mask material layer is a chemical vapor deposition (CVD) process, for example. Then, a photolithographic process and an etching process are implemented to pattern the mask material layer and the pad material layer so that a patterned pad layer 202 and a patterned mask layer 204 are formed.

Continually referring to FIG. 2A, a dry etching process is implemented to remove a portion of the substrate 200 by using the patterned mask layer 204 and the patterned pad layer 202 as a mask so that trenches 206 are formed in the substrate 200. The said dry etching process may use $CF_4/O_2/Ar$ as an etching gas.

Figure 2B:
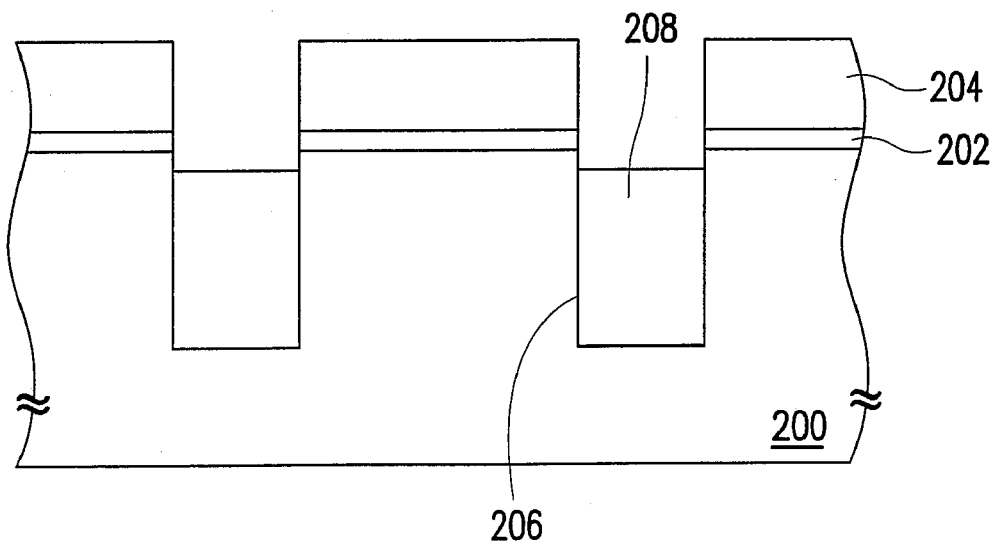

Then, referring to FIG. 2B, an insulation material layer (not shown) is formed on the substrate 200 and fills up the trenches 206. The material of the insulation material layer is silicon oxide and the method for forming the insulation material layer is a CVD process, for example. Next, for example, a chemical mechanical polishing process is implemented to remove the insulation material layer on the patterned mask layer 204 so as to form an insulation layer 208 in the trenches 206 by using the patterned mask layer 204 as a polishing stop layer. Thereafter, a wet etching process is implemented to remove the residual insulation material layer on the patterned mask layer 204 to avoid affecting the follow-up manufacturing process. Apparently, a portion of the insulation layer 208 is removed at the same time when the residual insulation material layer on the patterned mask layer 204 is removed by the wet etching process. Herein, hydrofluoric acid (DHF 200:1) is used as the etchant in the wet etching process.

Figure 2C:
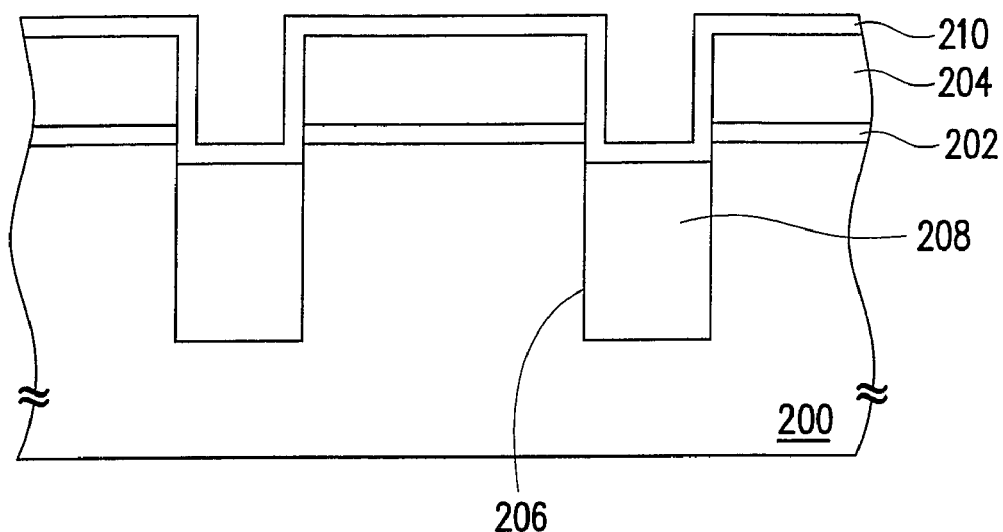

Next, referring to FIG. 2C, a protection layer 210 is conformally formed on the substrate 200. The material of the protection layer 210 may include SiON and the method for forming the protection layer 210 is a CVD process, for example. Forming the protection layer 210 is for preventing the insulation layer 208 from being damaged in the follow-up process so as to avoid affecting the performance of the components.

Figure 2D:
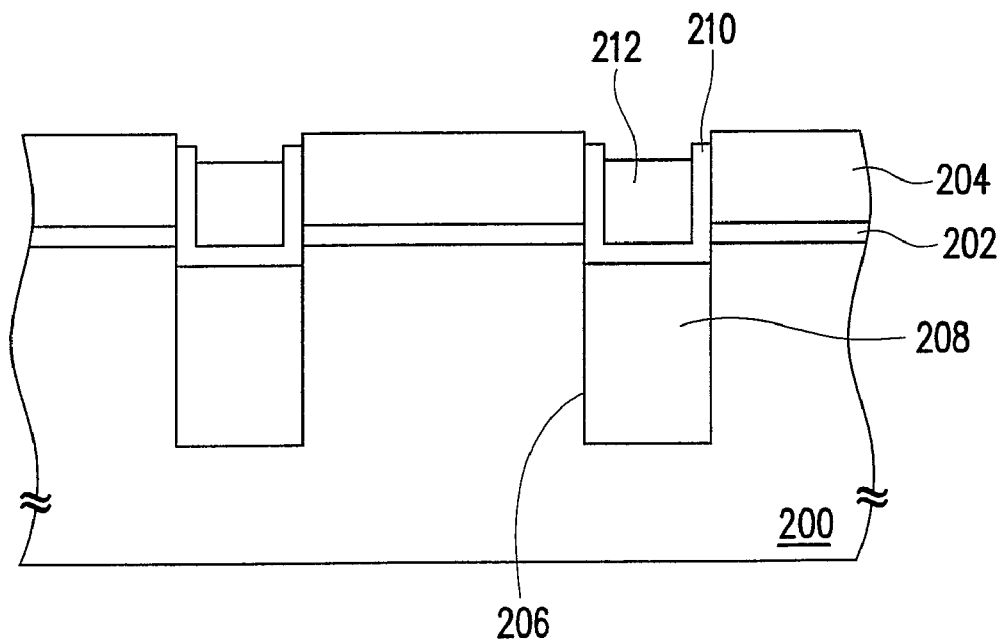

Following the foregoing, referring to FIG. 2D, another insulation material layer (not shown) is formed on the substrate 200. The material of the insulation material layer is silicon oxide and the method for forming the insulation material layer is the CVD process, for example. Similarly, the chemical mechanical polishing process is implemented to remove the insulation material layer and the protection layer 210 on the patterned mask layer 204 so as to form an insulation layer 212 on the protection layer 210 above the insulation layer 208 by using the patterned mask layer 204 as the polishing stop layer. The etching rate of the protection layer 210 is approximate to that of the insulation material layer, and hence, after the chemical mechanical polishing process is implemented, the wet etching process may also be implemented to remove the residual insulation material layer or the protection layer 210 on the patterned mask layer 204 so as to avoid affecting the follow-up process. Apparently, a portion of the protection layer 210 and a portion of the insulation layer 212 on the insulation layer 208 are removed while the residual insulation material layer or the protection layer 210 on the patterned mask layer 204 is being removed by the wet etching process. Herein, in the wet etching process, phosphoric acid ($H_3PO_4$) is used as the etchant.

Figure 2E:
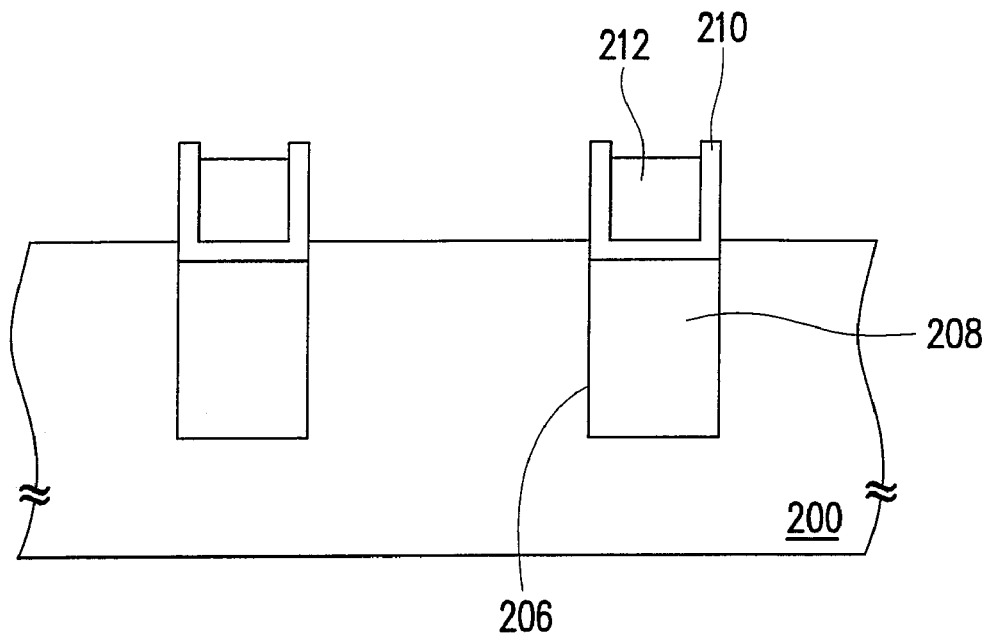

Afterwards, referring to FIG. 2E, the patterned mask layer 204 and the patterned pad layer 202 are removed. The method for removing the patterned mask layer 204 and the patterned pad layer 202 is, for example, a wet etching process using hydrofluoric acid (DHF 200:1) as the etchant. It should be noted that the residual insulation material layer or the protection layer 210 on the patterned mask layer 204 may have been removed in the previous step, and therefore, the patterned mask layer 204 and the patterned pad layer 202 can be completely removed in the current step.

It is important that the protection layer 210 has been formed above the insulation layer 208, and therefore, the insulation layer 208 can be prevented from being etched at the same time when the patterned mask layer 204 and the patterned pad layer 202 are removed by the aforementioned wet etching process so as to prevent the insulation layer 208 from being etched and forming divots at the corner regions of the insulation layer 208.

Figure 2F:
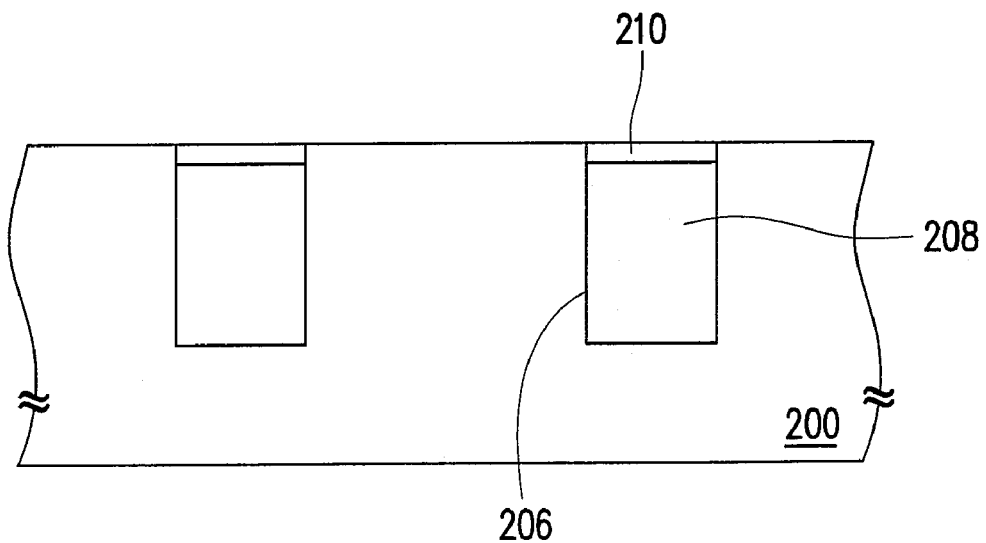

Continually, referring to FIG. 2F, for example, a wet etching process is implemented to remove a portion of the protection layer 210 and the insulation layer 212 so as to form the STI structure. Herein, in the wet etching process, hydrofluoric acid (DHF 500:1) is used as the etchant. In the present embodiment, for example, a portion of the protection layer 210 and the insulation layer 212 are removed by the wet etching process so that the height to the surface of the protection layer 210 on the insulation layer 208 is substantially equal to that to the surface of the substrate 200. Apparently, in other embodiments, the thickness of the protection layer 210 can be controlled while the protection layer 210 is being formed depending on the actual needs of manufacturing processes so that the surface of the protection layer 210 on the insulation layer 208 is higher than the surface of the substrate 200 after the aforementioned wet etching process is implemented.

In more detail, in order to render the step height on the substrate surface with better uniformity, the height of the formed STI structure can be controlled by adjusting the thickness of the protection layer 210 so as to avoid excessive difference in the step height of the substrate surface.

According to the above description, a protection layer and another insulation layer are formed on the insulation layer previously formed in the trenches before the patterned mask layer and the patterned pad layer are removed in accordance with the present invention. Accordingly, in the follow-up manufacturing process, the insulation layer formed in the trenches is prevented from being damaged and forming divots at the corner regions of the insulation layer so as not to affect the follow-up manufacturing process and cause a short circuit in components.

Furthermore, in the process for manufacturing the STI structure in the present invention, the height of the formed STI structure can be further controlled by adjusting the thickness of the protection layer to improve uniformity in the step height on the substrate surface.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a shallow trench isolation (STI) structure, comprising:
    providing a substrate with a mask material layer thereon;
    forming trenches in the substrate and in the mask material layer;
    forming a first insulation layer to simultaneously cover the substrate and completely fill the trenches;
    forming a protection layer on the first insulation layer and a sidewall of each of the trenches;
    forming a second insulation layer above the first insulation layer to allow the second insulation layer to be surrounded by the protection layer, wherein the method for forming the second insulation layer comprises:
        forming an insulating material layer on the substrate; and
        implementing a chemical mechanical polishing process by using the mask material layer as a polishing stop layer; and
    removing the mask material layer, a portion of the protection layer and the second insulation layer entirely to form the shallow trench isolation.

2. The method for manufacturing the STI structure of claim 1, wherein the material of the protection layer comprises silicon oxynitride.

3. The method for manufacturing the STI structure of claim 1, wherein the method for removing the mask material layer, a portion of the protection layer and the second insulation layer entirely comprises a wet etching process.

4. The method for manufacturing the STI structure of claim 1, further comprising implementing a wet etching process after the first insulation layer is formed and before the protection layer is formed.

5. The method for manufacturing the STI structure of claim 1, wherein the method for forming the first insulation layer comprises:
    forming an insulating material layer on the substrate; and
    implementing a chemical mechanical polishing process by using the mask material layer as a polishing stop layer.

6. The method for manufacturing the STI structure of claim 1, wherein the material of the mask material layer comprises silicon nitride.

7. The method for manufacturing the STI structure of claim 1, wherein the material of the first insulation layer comprises silicon oxide.

8. The method for manufacturing the STI structure of claim 1, wherein the material of the second insulation layer comprises silicon oxide.

* * * * *